United States Patent
Pio et al.

[11] Patent Number: 5,894,146
[45] Date of Patent: Apr. 13, 1999

[54] EEPROM MEMORY CELLS MATRIX WITH DOUBLE POLYSILICON LEVEL AND RELATING MANUFACTURING PROCESS

[75] Inventors: Federico Pio, Milan; Paola Paruzzi, Robbiate, both of Italy

[73] Assignee: SGS-Thomson Microelectronics, S.r.l., Agrate Brianza (MI), Italy

[21] Appl. No.: 08/607,067

[22] Filed: Feb. 26, 1996

Related U.S. Application Data

[60] Provisional application No. 60/010,585, Jan. 25, 1996.

[30] Foreign Application Priority Data

Feb. 28, 1995 [EP] European Pat. Off. ............... 95830064

[51] Int. Cl.[6] .......................... H01L 29/76; H01L 29/788
[52] U.S. Cl. ..................... 257/319; 257/316; 257/317; 257/321
[58] Field of Search .................................. 257/315, 316, 257/317, 319, 321

[56] References Cited

U.S. PATENT DOCUMENTS

| | | |
|---|---|---|
| 4,766,088 | 8/1988 | Kono et al. . |
| 5,326,999 | 7/1994 | Kim et al. . |
| 5,472,892 | 12/1995 | Gwen et al. .............................. 437/43 |

FOREIGN PATENT DOCUMENTS 0255159  2/1988  European Pat. Off. .

OTHER PUBLICATIONS

Patent Abstracts of Japan, vol. 16 No. 521 (E-1285), 27 Oct. 1992 & JP-A-04 196175 (Fujitsu Ltd.).

Patent Abstracts of Japan, vol. 13 No. 459 (E-832), 17 Oct. 1989 & JP-A-01 179369 (Toshiba Corp.).

*Primary Examiner*—Ngân V. Ngô
*Attorney, Agent, or Firm*—David V. Carlson; Kevin S. Ross; Seed and Berry LLP

[57] ABSTRACT

A matrix of EEPROM memory cells having a double polysilicon level of MOS technology and being arranged into rows and columns is monolithically integrated on a substrate of semiconductor material. Each cell comprises, in series, a transistor of the floating gate type which includes two layers of polysilicon superposed on each other and separated by an intervening layer of a dielectric material, and a selection transistor having a gate which comprises a first layer of polysilicon. The gates of the selection transistors in one row of said matrix are connected electrically together by a selection line comprising a second layer of polysilicon overlying the first layer. The intermediate layer of dielectric material is also partly interposed between the first and second layers of polysilicon such that the two layers are in contact at at least one zone of said selection line. Preferably, the contact zone is formed over field oxide regions and is away from the edges of the selection line. The matrix can advantageously be fabricated by a process of the self-aligned type, without making the process any more complicated.

18 Claims, 5 Drawing Sheets

EEPROM MEMORY CELLS MATRIX WITH DOUBLE POLYSILICON LEVEL AND RELATING MANUFACTURING PROCESS

This application claims the benefit of U.S. Provisional application Ser. No. 60/010,585, filed Jan. 25, 1996.

DESCRIPTION

1. Field of the Invention

This invention relates to an EEPROM memory cells matrix with double polysilicon level and related manufacturing process.

In particular, the invention concerns a cells matrix in MOS technology, wherein the cells are arranged into rows and columns and integrated monolithically on a substrate of semiconductor material. Each cell comprises, placed in series with each other, a transistor of the floating gate type, having two superposed layers of polysilicon which are separated by an intervening layer of a dielectric material, and a selection transistor having a gate which comprises a first polysilicon layer. The gates of the selection transistors in one row of the matrix are connected electrically together by a selection line which comprises a second polysilicon layer overlying the first layer.

Reference will be made in this description to such an application of the invention.

The invention also relates to a process for manufacturing with MOS technology a matrix of memory cells of the above type.

2. Prior Art

As well known, non-volatile memories of the EEPROM type allow the information contained in the cell matrix to be modified electrically at the programming stage, both during the write and the erase steps thereof.

In addition, the information contained in each individual cell can be modified independently of the other cells. This feature ensues from the provision, in each cell, of a selection transistor placed in series with the element whereinto the information is stored. The selection transistor enables a given row to be selected either for programming or reading the individual cell.

As known, for memories of the non-volatile type, the cells are integrated on a substrate of semiconductor material, usually monocrystalline silicon, and arranged into rows and columns to form the cell matrix. The information-storing element of the cell is a MOS transistor of the floating gate type. The logic state or level, of the cell is determined by the amount of charge contained in the floating gate of the transistor. Non-volatile memories of standard types are programmed in two logic states, a written and an erased one, for storing one bit per cell.

Especially with EEPROMs, the charge amount is altered by having charges passed, by tunnel effect, through a thin layer of silicon oxide, the so-called tunnel oxide which is interposed between the substrate of semiconductor material and the floating gate of the transistor, in an active region.

In the floating gate transistors of EEPROM cells, of the type known as FLOTOX, the floating gate also extends laterally beyond the tunnel oxide region.

There are EEPROMs of two basic types: a first type which is provided with a single level of polysilicon, namely polycrystalline silicon—briefly, "poly"—and a second type with two levels of polysilicon, to which the present invention is specifically related. The current trend of the relevant art is discussed, for instance, in H. E. Meas et al. "Trends in semiconductor memories", Microelectronics Journal, Vol. 10, 1989. Although its manufacture involves a relatively more complicated process, this second type of memory cells, having reduced overall circuit area requirements by a factor of 1.5 to 2.5, affords increased information storage density for a given area.

The selection transistor associated with each cell also is, according to the prior art, fabricated with MOS technology, and includes a polysilicon gate which is coupled electrically to the substrate by means of a thin oxide layer, called the gate oxide, which is formed directly on the substrate in an active region thereof. This gate substantially is formed of a polysilicon layer which at the formation stage corresponds, according to the prior art, to one of the polysilicon layers of the floating gate transistor. In accordance with another, more recent technique, the gates of the selection transistors include a first layer of polysilicon and are connected electrically, along the same row in the matrix, by a selection line which comprises a second layer of polysilicon overlying the first. The two layers are shorted together throughout the selection line to form a thicker single layer. The last mentioned case has been discussed, for example, in European Patent Applications No.s 93830061.3 and 93830062.1 filed on Feb. 19, 1993 by this Applicant.

To lower the space requirements, and hence the production cost, of such cells, the current trend favors a cell structure which can be made by a process allowing for reduced misalignment tolerances. Thus, in the specific instance of EEPROM cells having double polysilicon level, a so-called self-aligned process is often used, wherein the two polysilicon layers of the floating gate transistor, and possibly of the selection transistor as well, are patterned simultaneously using a photolithography technique.

This prior process consists, as relates to the case discussed in the above Patent Applications, of:

- defining along the rows a first layer of polysilicon, or poly 1, for the floating gate,
- depositing subsequently a layer of intermediate dielectric,
- removing the dielectric layer from the region occupied by the selection lines,
- depositing a second layer of polysilicon, or poly2, and self-alignedly removing the poly1/dielectric/poly2 stack to pattern the floating gate and control gate of the transistor, as well as the gate of the selection transistor.

Such a process may pose problems from the inherent misalignment of different masks successively employed during the cell formation, basically the masks used to remove the intermediate dielectric and the stack. Dependent on the shapes of the masks, that is on whether the masks used for removing the interpoly dielectric and the whole poly2/interpoly/poly1 stack overlap each other or not, a pit in the silicon substrate may be dug all over the region of the active area encompassed by the aperture in the mask used to remove the interpoly dielectric; or conversely, a polysilicon buildup may occur between the selection transistor and the floating gate transistor.

The underlying technical problem of this invention is to provide a matrix of EEPROM cells, in particular a structure of a selection transistor, which can be formed by a process wherein neither are pits dug into the substrate nor polysilicon buildups allowed over the substrate in regions within the cell matrix. Concurrently therewith, the matrix of memory cells to which this invention is directed should be simple to make.

The problem is also one of providing a cells matrix which can be fabricated by process steps which make for a limited introduction of tolerances, while ensuring the full operability of the device even where misalignments occur between successive masks.

A particular object is to provide a cell which has reduced integration area requirements.

SUMMARY OF THE INVENTION

In accordance with this invention, a matrix of EEPROM cells with double polysilicon level, being arranged into rows and columns and monolithically integrated on a substrate of a semiconductor material, usually of monocrystalline silicon, is of the type wherein each cell comprises a floating gate MOS transistor in series with a selection MOS transistor.

The floating gate transistor allows the information to be stored, and includes a floating gate and overlying control gate which are both formed of polysilicon and are separated by a layer of a dielectric material. The selection transistor includes a gate of polysilicon having a first layer of polysilicon; the gates of selection transistors in one row are connected electrically together by a selection line which includes a second layer of polysilicon overlying the first layer.

According to this invention, partially formed between the first and second layers in the selection line is an intermediate layer of a dielectric material. The two layers of polysilicon are in direct contact with each other in at least one zone of the selection line.

In a preferred embodiment, the above-mentioned zone is formed over field oxide regions, periodically within the matrix or beyond it.

According to one solution provided by the present invention, the gates of the selection transistors in one row of a matrix of EEPROM cells are connected electrically together by a selection line which comprises a second polysilicon layer overlying the first layer.

Also, according to the principles of the present invention, a process is provided for manufacturing with MOS technology, a matrix of EEPROM cells having two levels of polysilicon where gates of the selection transistors are formed from the first layer of polysilicon, and a selection line formed from the second layer of polysilicon is electrically connected to the polysilicon gates of the selection transistors in one row.

The features and advantages of a matrix of EEPROM cells according to the invention will be apparent from the description of an embodiment thereof, given by way of example and not of limitation with reference to the accompanying drawings.

DETAILED DESCRIPTION

A description of a first embodiment of a matrix of EEPROM memory cells having double polysilicon level, according to the invention, will be given herein below with initial reference to a preferred scheme of a single cell, shown in FIG. 1. The cell is depicted as a top view and is denoted by the reference numeral 1. The cell shown would be repeated a large number of times to provide a matrix wherein identical or symmetrical cells are arranged into rows and columns. The dimensions relate illustratively to a cell of 0.8-micron technology having a capacitive coupling of 0.7 between the control gate and the floating gate.

The EEPROM memory cell of this invention has two levels of polysilicon. Its basic construction is consistent with that of conventional cells of the ETOX type as used in FLASH-EPROMs.

Each cell 1 comprises a floating gate MOS transistor, denoted by 2, having a selection MOS transistor, denoted by 3, formed in series therewith.

The structures and layers of the cell topography are shown separately and successively in FIGS. 2–7, for clarity.

The cell 1 structure is formed on a substrate of a semiconductor material, usually of a monocrystalline silicon material.

Figure 1:
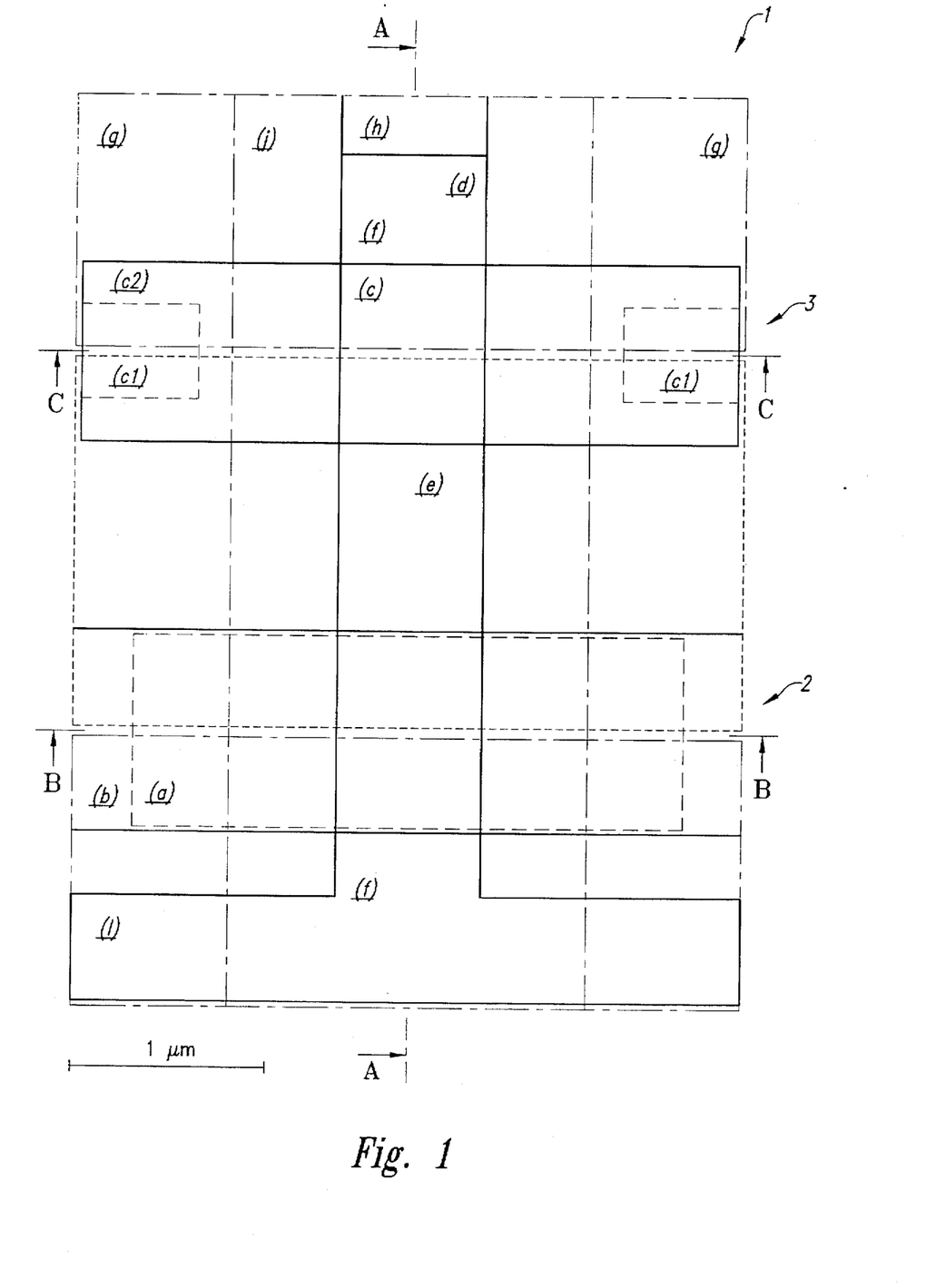
FIG. 1 is a top view showing schematically a first embodiment of an EEPROM cell according to this invention.
Figure 2:
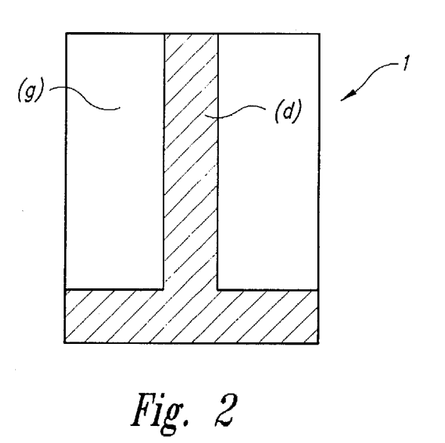
FIGS. 2–7 are top views of the same cell, separately bringing out the structures and layers of its topography.

With reference to FIGS. 1 and 2, shown at (d) are the active area regions, being complementary of the so-called field oxide (g) regions wherein a thick oxide layer is formed over the substrate.

Figure 3:
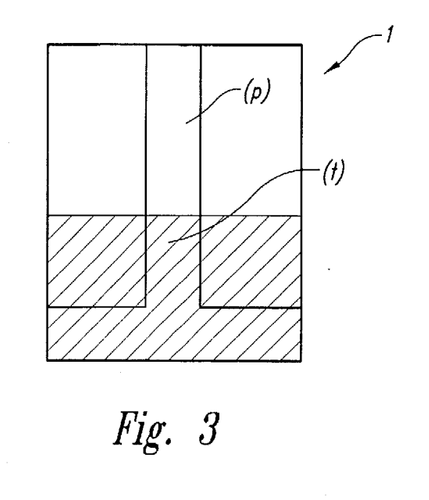

Formed over the substrate in the active area region, at the transistor 2, is a thin region of so-called tunnel oxide (t), shown in FIG. 3. A thin gate oxide (p), which may be a different thickness, is correspondingly formed in the active area region of the selection transistor 3.

Figure 4:
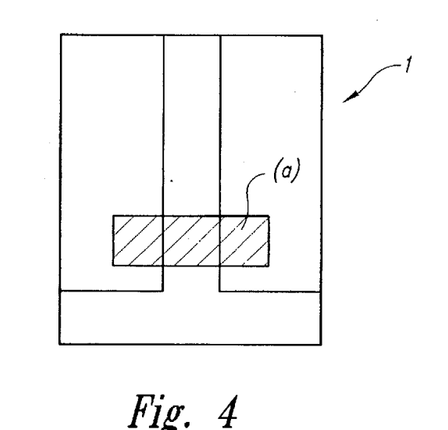

The floating gate of the transistor 2, including a first polysilicon layer, is represented by region (a) in FIGS. 1 and 4. It functions to store information, i.e. some charge which enables the two states of written and erased to be identified.

Figure 5:
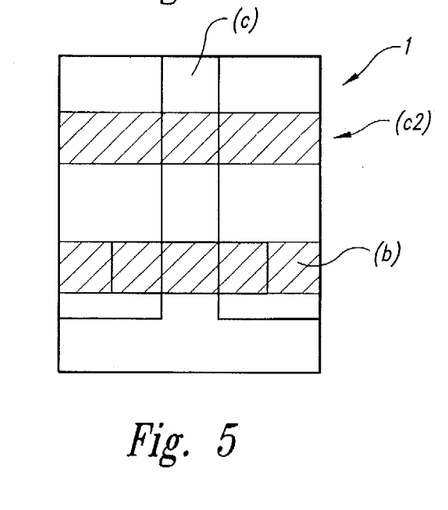

Formed on top of the floating gate is a control gate of that transistor 2 which comprises a second layer of polysilicon and is denoted by (b) in FIGS. 1 and 5. The control gate further comprises, in accordance with a preferential prior technique, an overlying layer of silicide, better shown in cross-section in later Figures.

The control gate (b) is capacitively coupled to the floating gate (a) through an intermediate dielectric layer, referred to hereinafter as the interpoly dielectric. The control gate (b) electrode is common to all the cells in one row or sector of the matrix.

FIGS. 1 and 5 also show a gate region (c) of the selection transistor 3 which overlies an active area region. The gate (c) comprises the first layer of polysilicon in one embodiment of this invention. The gates of the selection transistors in one row are connected electrically together by a selection line which is represented by region (c2) in the portion occupied by the cell 1. The selection line (c2) includes the aforementioned second layer of polysilicon, overlying the first and being partially isolated therefrom by a layer of interpoly dielectric.

Figure 6:
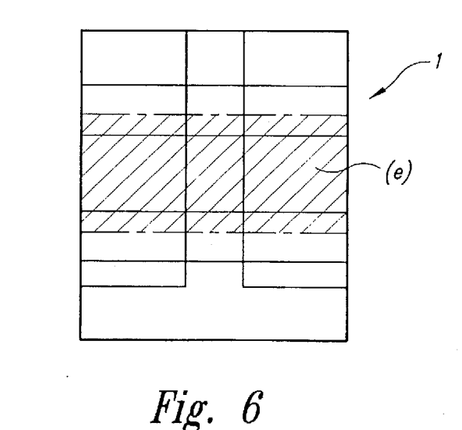

In the region shown at (e) in FIGS. 1 and 6, between the respective gates of the transistors 1 and 2, namely between regions (b) and (c), there may be provided, in accordance with a prior art technique, a double implant of arsenic and phosphorus for the purpose of reducing the so-called band-to-band current.

This is a phenomenon discussed, for example, in L. Ravazzi et al. "Comparison degradation effects in abrupt and graded N+-P gated junctions due to band-to-band tunnel current", ESREF 1990, Oct. 2–5, 1990, Bari, IT.

Figure 7:
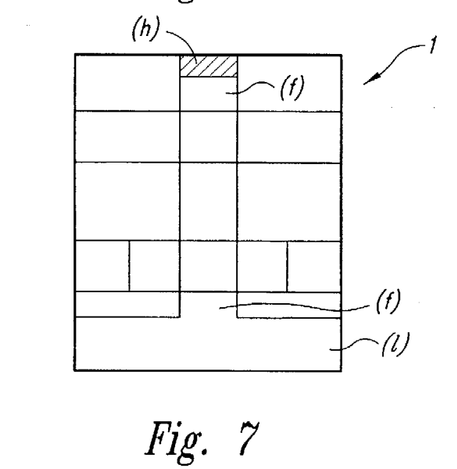

Shown at (f) in FIGS. 1 and 7 are source and drain doped regions of the cell, where an implant is performed, typically arsenic. Furthermore, (h) is a drain contact, in common with cell 1 and a cell, not shown in the Figures, which is formed on top of the cell 1 and has a symmetrical structure therewith. The source regions in one row or sector of cells are interconnected by line (1) in common, within the matrix, with the cell 1 and an underlying cell symmetrical therewith. The source line may be of the SAS (Self-Aligned Source) type. The reference (i), only appearing in FIG. 1, identifies a metallic interconnect line between the drain contacts of cells belonging to the same column in the memory matrix.

According to this invention, the first and second polysilicon layers of the selection transistor 3 in the regions (c1) shown in FIG. 1 are in direct contact. The intermediate layer is removed from between the two layers of polysilicon in the regions (c1) but is left there through the remainder of the selection line (c2), and in particular over the gate regions (c). Such regions (c1) advantageously locate, in a preferred embodiment and as shown in the Figure, in zones where the selection line spans field oxide (g) regions.

The contact regions (c1) lie, as shown in FIG. 1, within the selection line (c2) and away from the edges of the latter, in a preferred embodiment of the invention, as discussed hereinafter in connection with a manufacturing process therefor.

Figure 8:
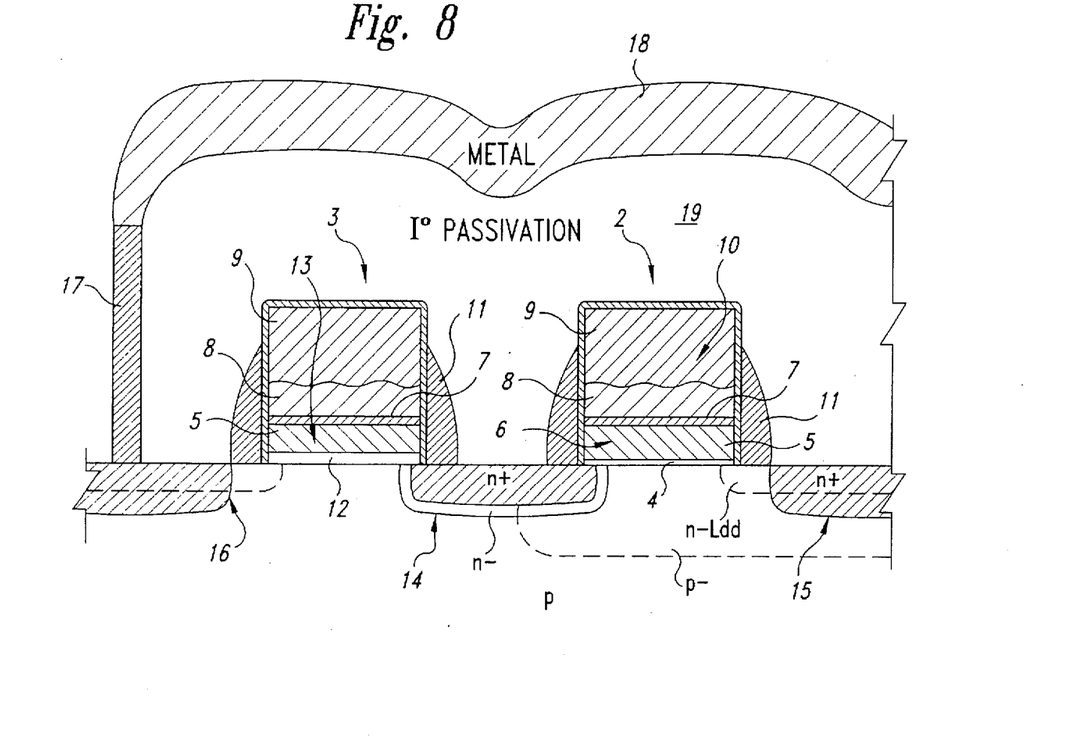
FIG. 8 is a vertical section view taken along line A—A in FIG. 1.
Figure 9:
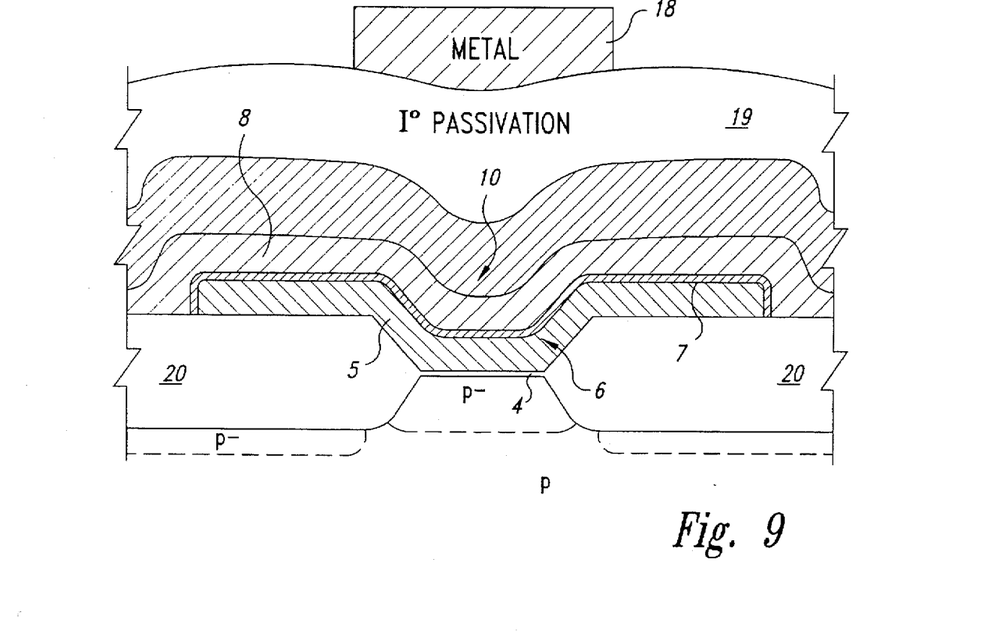
FIG. 9 is a sectional view taken along line B—B through the floating gate transistor.
Figure 10:
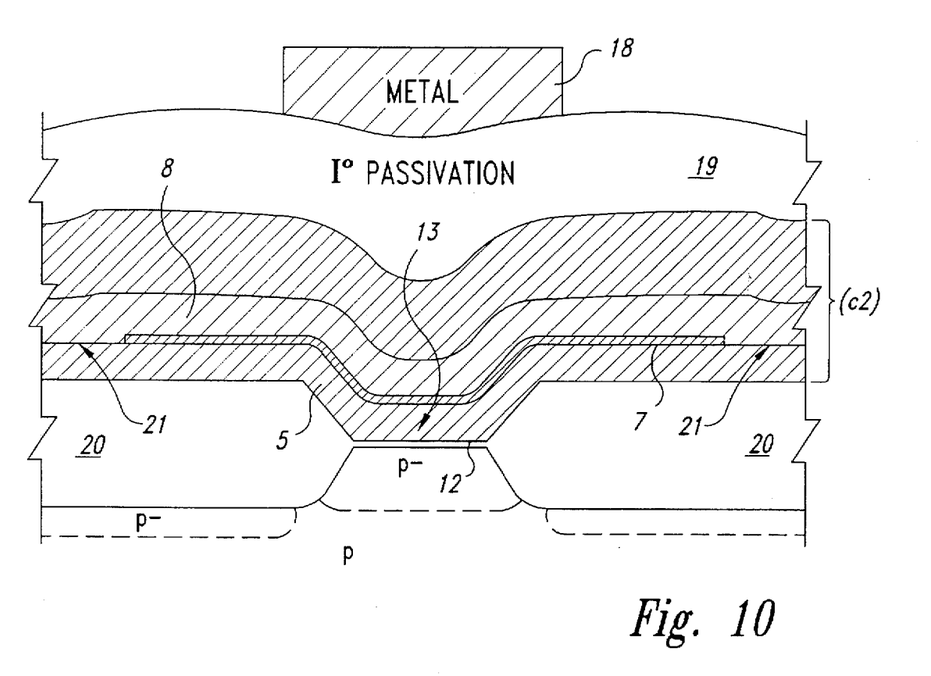
FIG. 10 is a vertical section view of the selection transistor, as taken along line C—C.

FIGS. 8, 9 and 10 are vertical section views, not to scale, of the cell 1, taken along parallel directions to the rows and the columns.

Specifically, FIG. 8 is a sectional view taken along a line A—A drawn in FIG. 1 through the active area region of the floating gate transistor 2 and the selection transistor 3, along the source-to-drain direction. The floating gate transistor 2 includes a thin layer of tunnel oxide 4, formed directly on the substrate, which is successively overlaid by the first polysilicon layer 5 forming the floating gate 6, the interpoly dielectric 7, and the second polysilicon layer 8, the latter being in turn overlaid, in accordance with a prior art technique, by a silicide layer 9. The control gate of the transistor 2 is denoted by 10. Formed laterally of the the gates of the transistor 2 are so-called spacer oxide layers 11. The selection transistor 3 is similarly formed. The thin gate oxide is denoted by 12 and the gate, including the first polysilicon layer 5, denoted by 13. As can be seen, no differences stand out in cross-section along this direction between the floating gate transistor 2 and the selection transistor 3, but for the different thickness of the tunnel oxide 4 from that of the gate oxide 12.

Also shown schematically in FIG. 8 are implanted regions 14, which correspond to the regions (e) in FIG. 6, and the source and drain regions, 15 and 16. A drain contact 17 is conventionally connected to a metallization line 18 which is separated by a passivation layer 19 from the transistors 2 and 3 of the cell 1.

FIGS. 9 and 10 are respective sectional views of the floating gate transistor 2 and the selection transistor 3, taken along lines B—B and C—C in FIG. 1, perpendicularly to the source-to-drain direction. In these Figures, a layer of field oxide 20, not shown in FIG. 8, extends laterally of the central active area region. The first polysilicon layer 5 of the floating gate 6 of the transistor 2 and of the gate 13 of the selection transistor 3 extends partly thereacross.

From a comparison of these two Figures, the difference can be clearly noticed which exists between the floating gate transistor 2 and the selection transistor 3. In the floating gate transistor 2, the first polysilicon layer 5, i.e. the floating gate 6, is fully isolated by means of the interpoly dielectric 7. In the selection transistor 3, the first polysilicon layer 5, included in the gate 13, is instead in contact with the second polysilicon layer 8 of the selection line, in the regions 21 that correspond to the regions (c1) in FIG. 1.

In accordance with this invention, the first polysilicon layer 5 of the selection transistor 3 and the overlying second polysilicon layer 8 are in electric contact with each other. Therefore, the gates of the selection transistors in one row or sector will be connected electrically together and to the selection line, which is applied a voltage for selecting the row or sector. In this way, the operability of the inventive cell can be ensured, by providing electric continuity between the two layers of polysilicon at a low access resistance to the gates of selection transistors.

The contact between the two layers of polysilicon is, as brought out by the embodiment just described, conveniently effected on field oxide. This prevents, as more fully explained hereinafter, problems with the cell formation, and especially in forming the selection transistor.

In accordance with the invention, the contact zone between the two polysilicon layers need not be provided at each cell, and can be repeated periodically every N cells. For example, a contact zone may be formed for each byte, each pair of bytes, or each source line. Increased distance from one contact to the next results in higher series resistance, as seen from the farthest cell from that contact.

Where the matrix is discontinued periodically, such as in order to accommodate so-called voltage switches, the two layers of polysilicon in the selection line can be shorted in these zones. Furthermore, the contact zone could still lie within the selection line, but outside the matrix.

Figure 11:
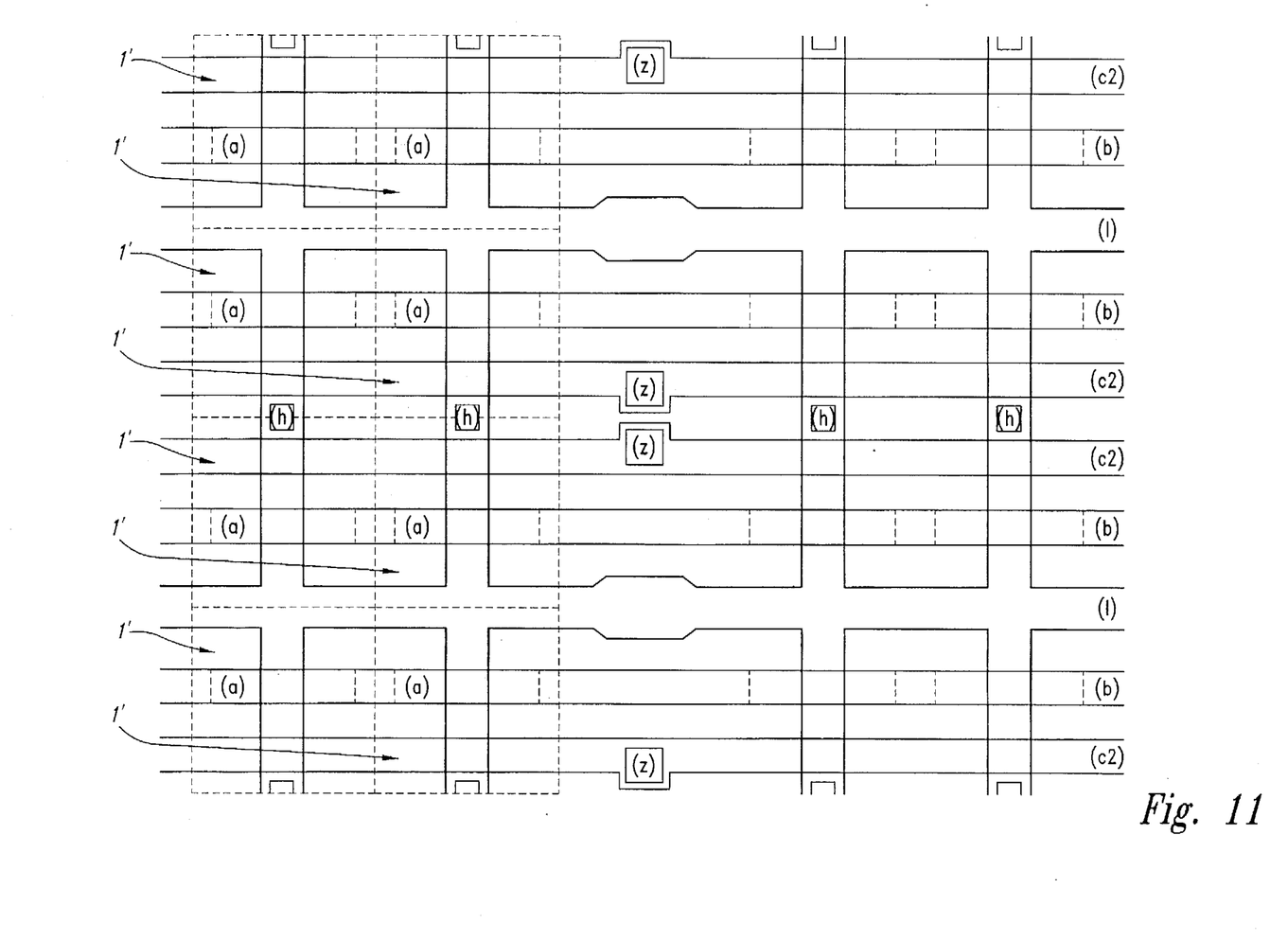
FIG. 11 is a top view of a portion of a cells matrix, according to a second embodiment of this invention.

Shown in FIG. 11 is a second embodiment of the invention wherein the two layers of polysilicon are in contact along the selection line at each byte. This Figure shows a top view of a portion of a matrix of memory cells, with each cell being designated 1' and constructed in accordance with the invention. Indicated at (z) are those zones of the selection line where the first and second polysilicon layers contact each other. The regions (z) are advantageously formed within pads, i.e. within enlarged areas of the selection line. These areas enable contact regions (z) to be formed with sufficient breadth, while limiting any problems from misalignment during their formation.

Where the spacing between any two adjacent selection lines is insufficient to accommodate a pair of corresponding pads, one pad may be formed every two bytes, alternately on the two lines.

The process steps for manufacturing a matrix of EEPROM cells according to the invention will now be described in detail with reference to the previous Figures.

Preferably, a self-aligned process is used to form the cell matrix of this invention. Reference will be made, therefore, specifically to a process of this type.

The forming process comprises the following steps:
forming the active area regions and isolation regions, i.e. the field oxide 20;
growing by thermal oxidation a thin oxide, namely the tunnel oxide 4 and gate oxide 12, in the active area regions, to possibly different thicknesses, respectively in those zones where the floating gate transistor 2 and the selection transistor 3 are to be formed;
forming, usually by deposition, a first polysilicon layer 5 over the whole matrix;

patterning, using a photolithographic masking technique followed by etching, the first polysilicon layer S in the zones occupied by the floating gate transistor 2 along a parallel direction to the source-to-drain lines, thereby to define the floating gates 6 in that direction; in practice, the polysilicon layer would only be removed from the regions included between two contiguous floating gates in one row;

growing or depositing an interpoly dielectric layer 7 all over the matrix;

removing that interpoly dielectric layer 7, in accordance with the invention, from just regions 21 lying within the selection lines (c2) and away from their edges at locations where the two polysilicon layers 5 and 8 are to contact each other;

forming the second polysilicon layer 8, optionally followed by a silicide layer 9, all over the cells matrix; and photolithographically defining and then etching away the poly2/interpoly/poly1 stack in a perpendicular direction to the source-to-drain direction to fully pattern in a self-aligned fashion the control gate 10 and floating gate 6 of the floating gate transistor 2, as well as the selection line (c2).

The process is completed with well-known steps of implantation, formation of the oxide spacers 11, deposition of the passivation layer 19, and formation of contact openings and metallization layers 18.

In accordance with this invention, as previously described, the mask used to etch away the poly2/interpoly/poly1 stack will completely cover the openings in the mask used to etch away the intermediate dielectric layer. This is ensured by the contact zones between the two layers of polysilicon in the selection line being fully contained therein because away from its edges.

Thus, the proposed solution avoids the problem of the undesired formation of steps in the substrate or, conversely, of polysilicon buildups in the region between the floating gate transistor and the selection transistor.

It should be noted that during the precise patterning of the topography it will be necessary to take account of inherent misalignments during the masking step. For example, in manufacturing a matrix of memory cells of the type to which this invention relates, the maximum admissible misalignment would typically be about 0.3 microns using 0.8-micron technology. Accordingly, it is recommended that the contact zones between the first and second layers of polysilicon in the selection line be kept a sufficient distance away from the selection line edges to include such tolerances.

To this aim, as shown for instance in FIG. 11, pads would advantageously be formed, of preference, in the selection line to accommodate the contact zones.

Also, in the above embodiments of the invention, the contact zones are formed over field oxide regions not to damage active area regions in the event of excess misalignment occurring, for example.

Thus, the memory matrix of this invention allows a fabrication process to be used which provides the selection transistor while limiting the introduction of necessary tolerances during successive process steps, yet ensuring the device operability.

The process, moreover, may advantageously be a self-aligned one enabling the space requirements for the cells matrix to be reduced.

A matrix according to the invention involves no complications to its manufacturing process, either in terms of mask number or additional processing steps, compared to conventional processes for manufacturing a cells matrix.

It should be understood that changes and modifications may be made unto the matrix of memory cells herein described and illustrated, within the scope of the invention as defined in the following claims.

We claim:

1. A matrix of EEPROM memory cells with a double polysilicon level, in MOS technology, arranged into rows and columns, and monolithically integrated on a substrate of a semiconductor material, each memory cell comprising a transistor of the floating gate type including two superposed layers of polysilicon which arc separated by an intervening layer of a dielectric material, and a selection transistor in series with said floating gate transistor which has a gate comprising a first layer of polysilicon; the gates of the selection transistors in one row of said matrix of memory cells being connected electrically together by a selection line which comprises a second layer of polysilicon overlying the first layer, wherein the intermediate layer of dielectric material is partly interposed between said first and second layers of polysilicon such that the two layers are in direct physical contact in at least one contact region of said selection line.

2. The matrix of EEPROM memory cells according to claim 1 wherein said contact region where the first and second layers of polysilicon are in contact lies outside the gates of the selection transistors over regions where a layer of field oxide has been formed on the substrate.

3. The matrix of EEPROM memory cells according to claim 2 wherein said contact region is formed in equidistant regions within the matrix of memory cells.

4. The matrix of EEPROM memory cells according to claim 1 wherein the first and second layers of polysilicon of the selection line are in contact in a contact region located outside the matrix of memory cells.

5. The matrix of EEPROM memory cells according to claim 1 wherein said contact region between said first and second layers of polysilicon lies within said selection line, away from its edges.

6. The matrix of EEPROM memory cells according to claim 5 wherein said contact region is located within enlarged areas of said selection line.

7. An integrated EEPROM memory circuit of MOS technology wherein it comprises a matrix of memory cells, arranged into rows and columns, monolithically integrated on a substrate of a semiconductor material, each memory cell comprising a transistor of the floating gate type including two superposed layers of polysilicon which are separated by an intervening layer of a dielectric material, and a selection transistor in series with said floating gate transistor which has a gate comprising a first layer of polysilicon; the gates of the selection transistors in one row of said matrix of memory cells being connected electrically together by a selection line which comprises a second layer of polysilicon overlying the first layer, wherein the intermediate layer of dielectric material is partly interposed between said first and second layers of polysilicon such that the two layers are directly adjacent to and are in contact in at least one contact region of said selection line.

8. A nonvolatile memory circuit monolithically integrated on a substrate of semiconductor material and formed using double polysilicon MOS technology comprising:

a matrix of nonvolatile memory cells separated by field oxide regions formed on the substrate, the matrix of cells arranged into rows and columns, and each of the nonvolatile memory cells including:

a floating gate transistor having a first layer and a second layer of polysilicon wherein the first and the second layers are separated by an intervening layer of a dielectric material, and the first layer of polysilicon is separated from the substrate by a tunnel oxide, and a selection transistor coupled to the floating gate transistor, the selection transistor having a gate of the first layer of polysilicon, the intervening layer of a dielectric material, and being separated from the substrate by a gate oxide;

a selection line overlying the gates of the selection transistors in each row, separated from the gates by the intervening layer of a dielectric material; and at least one contact region in which the selection line directly contacts the gate of at least one of the selection transistors in each row causing the selection line to electrically connect at least one of the selection transistors in each row.

9. The nonvolatile memory circuit according to claim 8 wherein the selection line is formed of the second layer of polysilicon.

10. The nonvolatile memory circuit according to claim 8 wherein the gates of the selection transistors in each row and the selection line are directly connected through the at least one contact region.

11. The nonvolatile memory circuit according to claim 8 wherein the at least one contact region is located over one of the field oxide regions.

12. The nonvolatile memory circuit according to claim 8 wherein the at least one contact region is located outside the matrix of memory cells.

13. The nonvolatile memory circuit according to claim 12 wherein the at least one contact region is located within enlarged areas of the selection line.

14. A non-volatile memory circuit comprising:

a plurality of memory cells arranged in an array of rows and columns, each cell comprising a selection transistor having a first polysilicon layer separated from a second polysilicon layer by a dielectric layer, and each cell having a floating gate transistor;

a selection line comprising the first polysilicon layer separated from the second polysilicon layer by the dielectric layer, the selection line coupled to all of the selection transistors in one of the rows of the array, and the selection line running both inside and outside of the array; and a direct physical contact area in which the first and second polysilicon layers physically contact each other such that no dielectric layer separates the first and second polysilicon layers.

15. The memory circuit of claim 14 wherein at least one cell in each of the rows includes the contact area within its selection transistor.

16. The memory circuit of claim 14 wherein a plurality of the contact areas are evenly spaced among the selection transistors for any given row.

17. The memory circuit of claim 14 wherein the contact area couples the first and second polysilicon layers of the selection line in an area inside of the array.

18. The memory circuit of claim 14 wherein the contact area couples the first and second polysilicon layers of the selection line in an area outside of the array.

* * * * *